United States Patent
Okuda

(10) Patent No.: US 9,608,593 B2
(45) Date of Patent: Mar. 28, 2017

(54) FILTER DEVICE HAVING A FIRST INDUCTANCE IN A CHIP SUBSTRATE AND A SECOND INDUCTANCE IN A MOUNTING SUBSTRATE

(71) Applicant: Murata Manufacturing Co., Ltd., Nagaokakyo-shi, Kyoto-fu (JP)

(72) Inventor: Tetsuro Okuda, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 14/637,742

(22) Filed: Mar. 4, 2015

(65) Prior Publication Data

US 2015/0180447 A1 Jun. 25, 2015

(30) Foreign Application Priority Data

Sep. 19, 2012 (JP) .................................. 2012-205542

(51) Int. Cl.
*H03H 9/72* (2006.01)
*H03H 9/64* (2006.01)
(Continued)

(52) U.S. Cl.
CPC .......... *H03H 9/205* (2013.01); *H03H 9/0085* (2013.01); *H03H 9/0557* (2013.01);
(Continued)

(58) Field of Classification Search
CPC .... H03H 9/0085; H03H 9/0557; H03H 9/205; H03H 9/25; H03H 9/725; H03H 7/463; H03H 9/542
(Continued)

(56) References Cited

U.S. PATENT DOCUMENTS 7,944,325 B2 * 5/2011 Korden ................ H03H 9/0571
333/132
2003/0186673 A1 10/2003 Kimachi et al.
(Continued)

FOREIGN PATENT DOCUMENTS

JP 2003-298392 A 10/2003
JP 2003-332885 A 11/2003
(Continued)

OTHER PUBLICATIONS

Official Communication issued in International Patent Application No. PCT/JP2013/070913, mailed on Oct. 22, 2013.

*Primary Examiner* — Robert Pascal
*Assistant Examiner* — Jorge Salazar, Jr.
(74) *Attorney, Agent, or Firm* — Keating & Bennett, LLP

(57) ABSTRACT

A filter device with a ladder circuit configuration includes series arm resonators and parallel arm resonators, a filter component mounted on a mounting substrate and including a chip substrate and an elastic wave filter chip, a circuit configuration in which a plurality of series arm resonators and parallel arm resonators are defined by the elastic wave filter chip, and inductances are connected between ground-potential-side end portions of the plurality of parallel arm resonators and a ground potential, and in which at least one of the plurality of inductances is provided in the chip substrate and a remaining at least one inductance is provided in the mounting substrate.

14 Claims, 5 Drawing Sheets

(51) Int. Cl.
  *H03H 9/54* (2006.01)
  *H03H 9/205* (2006.01)
  *H03H 9/00* (2006.01)
  *H03H 9/05* (2006.01)
  *H03H 9/25* (2006.01)
  *H03H 7/46* (2006.01)

(52) U.S. Cl.
  CPC ............ *H03H 9/25* (2013.01); *H03H 9/6483* (2013.01); *H03H 9/725* (2013.01); *H03H 7/463* (2013.01); *H03H 9/542* (2013.01)

(58) Field of Classification Search
  USPC .................. 333/133, 186, 187, 193–196
  See application file for complete search history.

(56) References Cited

U.S. PATENT DOCUMENTS

| | | | |
|---|---|---|---|
| 2003/0214368 A1 | 11/2003 | Taniguchi | |
| 2003/0227357 A1* | 12/2003 | Metzger | H03H 9/0557 333/189 |
| 2005/0070332 A1 | 3/2005 | Yamato | |
| 2006/0139120 A1* | 6/2006 | Yamaguchi | H03H 9/6483 333/133 |
| 2007/0030094 A1 | 2/2007 | Omote | |
| 2009/0134958 A1* | 5/2009 | Mitani | H03H 9/02559 333/195 |
| 2009/0174497 A1 | 7/2009 | Korden | |
| 2009/0302970 A1 | 12/2009 | Hatano et al. | |
| 2013/0335164 A1* | 12/2013 | Maurer | H03H 9/605 333/133 |

FOREIGN PATENT DOCUMENTS

| | | | | |
|---|---|---|---|---|
| JP | 2005-124139 A | | 5/2005 | |
| JP | 2008-011125 A | * | 1/2008 | ............... H03H 9/25 |
| JP | 2008-271169 A | | 11/2008 | |
| JP | 2009-296508 A | | 12/2009 | |
| JP | 2009-544201 A | | 12/2009 | |
| JP | 2010-192974 A | | 9/2010 | |
| WO | 2006/016544 A1 | | 2/2006 | |
| WO | 2011/089746 A | | 7/2011 | |

\* cited by examiner

FILTER DEVICE HAVING A FIRST INDUCTANCE IN A CHIP SUBSTRATE AND A SECOND INDUCTANCE IN A MOUNTING SUBSTRATE

BACKGROUND OF THE INVENTION

1. Field of the Invention

The present invention relates to bandpass filter devices and more specifically relates to filter devices having a ladder circuit configuration.

2. Description of the Related Art

To date, surface acoustic wave filter devices having a ladder circuit configuration have been widely used in, for example, bandpass filters of mobile communication devices.

In Japanese Unexamined Patent Application Publication No. 2003-332885, an example of such a filter device is disclosed. In the filter device described in Japanese Unexamined Patent Application Publication No. 2003-332885, a surface acoustic wave filter device is mounted on a chip substrate. The surface acoustic wave filter device includes a piezoelectric substrate and an electrode structure formed on one main surface of the piezoelectric substrate. This electrode structure includes series arm resonators, parallel arm resonators and wiring conductors that electrically connect the series arm resonators and the parallel arm resonators to each other. Electrode lands, which are provided on the surface acoustic wave filter device and the chip substrate, are electrically connected to one another through bonding wires. In addition, surface mount terminal electrodes are formed on an outer surface of a package member in which the chip substrate is included.

To date, various configurations have been proposed for electrically connecting inductances, which are for band adjustment and so forth, to the series arm resonators and the parallel arm resonators in such a filter device having a ladder circuit configuration.

In the filter device described in Japanese Unexamined Patent Application Publication No. 2003-332885, inductances are formed on the piezoelectric substrate of the surface acoustic wave filter device and on a package member on which the surface acoustic wave filter device is mounted, for example, on the chip substrate.

However, in such a filter device, it has been difficult to obtain sufficient out-of-band attenuation.

In addition, it has been difficult to reduce the size of a filter device having a ladder circuit configuration and a structure in which the filter device is mounted on a mounting substrate.

SUMMARY OF THE INVENTION

Preferred embodiments of the present invention provide a filter device that achieves increased out-of-band attenuation and a reduction in size.

A filter device according to a preferred embodiment of the present invention includes a mounting substrate and a filter component mounted on the mounting substrate. The filter component includes a chip substrate and an elastic wave filter chip that is mounted on the chip substrate. The elastic wave filter chip has a ladder circuit configuration including a plurality of series arm resonators that are arranged in a series arm that connects an input terminal and an output terminal and each include an elastic wave resonator, and a plurality of parallel arms connected between the series arm and a ground potential, a parallel arm resonator including an elastic wave resonator being arranged in each of the parallel arms.

In a preferred embodiment of the present invention, a plurality of inductances is further provided and connected between ground-potential-side end portions of the parallel arm resonators arranged in the parallel arms and the ground potential. Among the plurality of inductances, at least one inductance is provided in the chip substrate and a remaining at least one inductance is provided in the mounting substrate.

In a certain specific aspect of the filter device according to various preferred embodiments of the present invention, the plurality of inductances, which are connected between ground-potential-side end portions of the plurality of parallel arm resonators and the ground potential, includes a first inductance and a second inductance. The first inductance is connected between a ground-potential-side end portion of one parallel arm resonator and the ground potential. The second inductance is connected between a common connection point at which ground-potential-side end portions of a plurality of the parallel arm resonators are commonly connected and the ground potential.

In another specific aspect of the filter device according to various preferred embodiments of the present invention, the chip substrate includes a first wiring conductor, the mounting substrate includes a second wiring conductor, a wiring resistance of the second wiring conductor is lower than a wiring resistance of the first wiring conductor, and the second inductance is provided by the second wiring conductor in the mounting substrate.

In yet another specific aspect of the filter device according to various preferred embodiments of the present invention, among plural first inductances, at least one of the inductances is provided in the chip substrate and a remaining first inductance is provided in the mounting substrate.

In still another specific aspect of the filter device according to various preferred embodiments of the present invention, the first inductance is provided in the chip substrate.

In still yet another aspect of the filter device according to various preferred embodiments of the present invention, the chip substrate preferably includes a high temperature firing ceramic and the mounting substrate preferably includes a low temperature firing ceramic having a firing temperature that is lower than that of the high temperature firing ceramic.

In the filter device according to various preferred embodiments of the present invention, an increase in out-of-band attenuation is achieved as a result of a plurality of inductances being provided and a reduction in size is also achieved because, among the plurality of inductances, at least one inductance is provided in the chip substrate and a remaining at least one of the inductances is provided in the mounting substrate.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
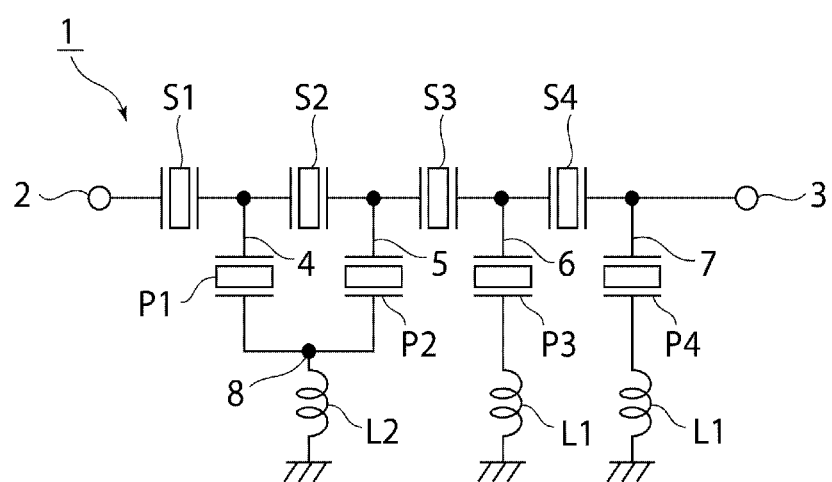
FIG. 1 is a circuit diagram of a filter device according to a preferred embodiment of the present invention.

Hereafter, the present invention will be made clearer by describing specific preferred embodiments of the present invention while referring to the drawings.

FIG. 1 is a circuit diagram of a filter device according to a preferred embodiment of the present invention. A filter device 1 of the present preferred embodiment includes an input terminal 2 and an output terminal 3. A plurality of series arm resonators S1 to S4 are arranged in a series arm that connects the input terminal 2 and the output terminal 3. A plurality of parallel arms 4 to 7 are provided so as to connect the series arm and a ground potential. Parallel arm resonators P1 to P4 are respectively arranged in the parallel arms 4 to 7.

The series arm resonators S1 to S4 and the parallel arm resonators P1 to P4 each preferably include a surface acoustic wave resonator.

Ground-potential-side end portions of the plurality of parallel arm resonators P1 and P2 are commonly connected to a common connection point 8. A second inductance L2 is connected between the common connection point 8 and the ground potential. A first inductance L1 is connected between a ground-potential-side side end portion of the parallel arm resonator P3 and the ground potential and another first inductance L1 is connected between a ground-potential-side end portion of the parallel arm resonator P4 and the ground potential.

In a ladder circuit configuration, a low-frequency-side attenuation pole and a high-frequency-side attenuation pole are respectively set using the resonant frequencies of the parallel arm resonators P1 to P4 and the antiresonant frequencies of the series arm resonators S1 to S4. That is, the passband of a ladder filter is configured by utilizing the resonance characteristics of the series arm resonators S1 to S4 and the parallel arm resonators P1 to P4.

Figure 2:
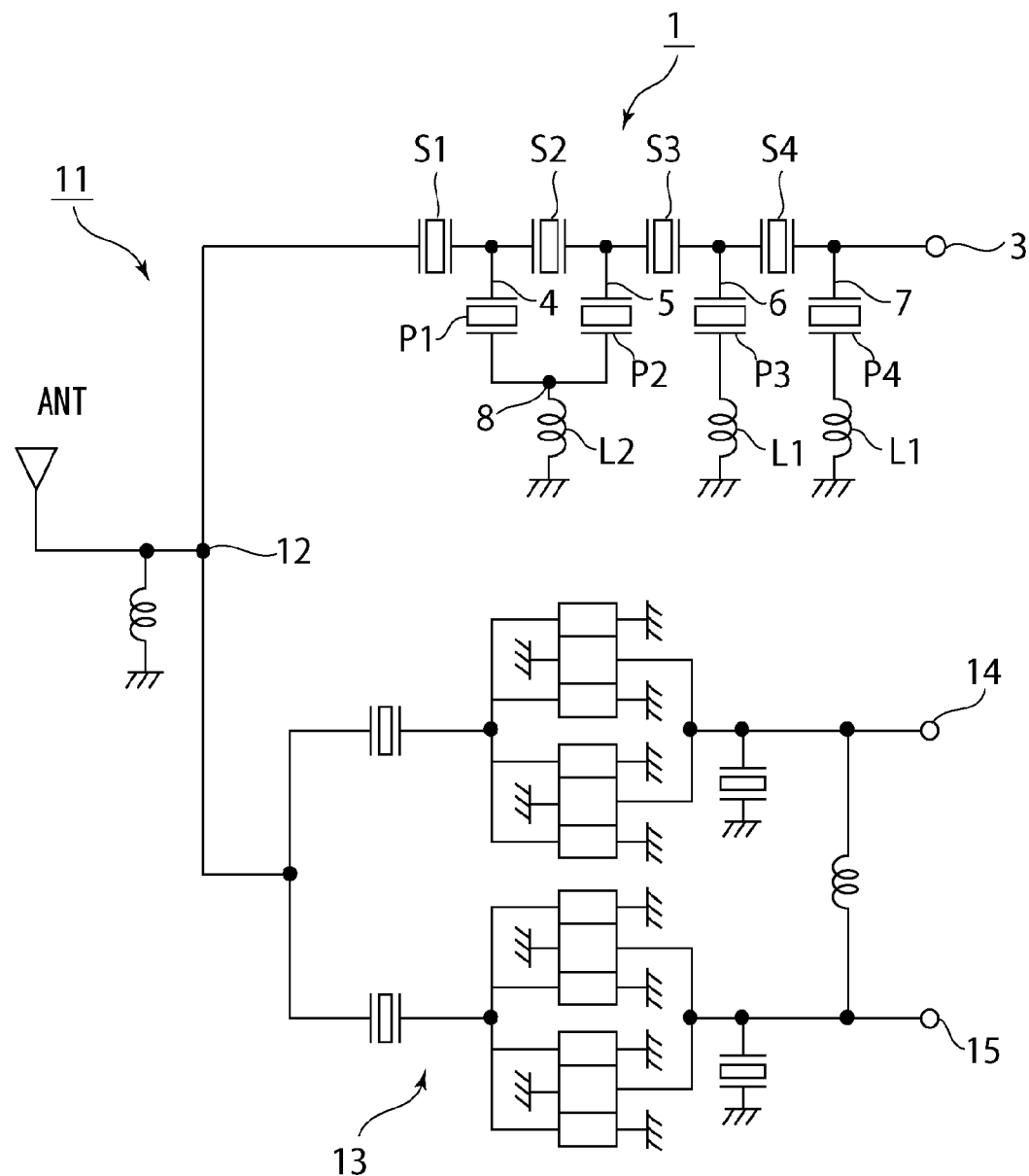
FIG. 2 is a circuit diagram of a duplexer to which the filter device of a preferred embodiment of the present invention is applied.

The filter device 1 preferably is, for example, suitably used as a transmission filter of a duplexer illustrated in FIG. 2. In a duplexer 11 illustrated in FIG. 2, a transmission filter is preferably defined by the filter device 1. That is, the filter device 1, which defines and serves as a transmission filter, is connected to an antenna terminal 12. A reception filter 13 includes first and second longitudinally coupled resonator type elastic wave filter units. The reception filter 13 has a balanced-unbalanced transforming function. Therefore, the reception filter 13 is connected between the antenna terminal 12 and first and second reception terminals 14 and 15.

Figure 3:
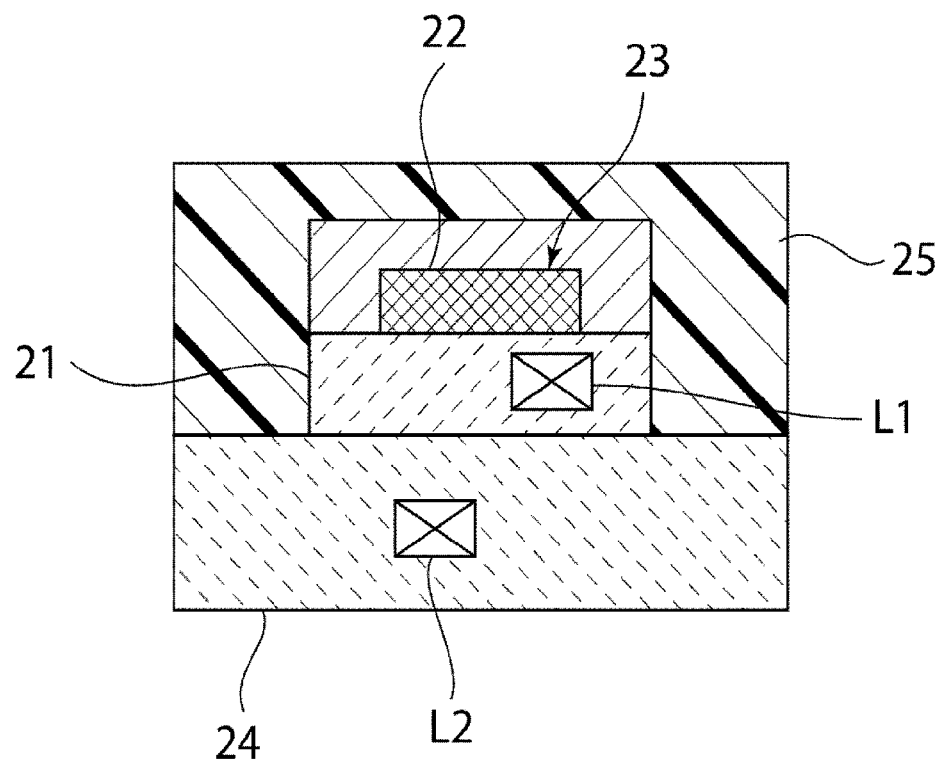
FIG. 3 is a schematic sectional view of the filter device according to a preferred embodiment of the present invention.

Along with reducing the size of the duplexer 11 and so forth, reduction of the size of the filter device 1 is also strongly demanded. Accordingly, the filter device 1 of this preferred embodiment of the present invention, as illustrated in FIG. 3, includes a filter component 23 in which an elastic wave filter chip 22 is mounted on a chip substrate 21. This elastic wave filter chip 22 includes a piezoelectric substrate and an electrode structure provided on one surface of the piezoelectric substrate. In addition, the chip substrate 21, in this preferred embodiment of the present invention, preferably includes a high temperature firing insulating ceramic (HTCC), which is typically used as a chip substrate. Of course, the chip substrate 21 may be made of another insulating material.

The filter component 23 is preferably mounted on a mounting substrate 24. The mounting substrate 24 is, for example, a substrate that mounts the transmission filter 1 and the reception filter 13 of the duplexer 11. Alternatively, the mounting substrate 24 may be a printed board for an electronic circuit, for example. That is, so long as the mounting substrate 24 is a substrate on which the filter component 23 is mounted, the mounted substrate 24 is not particularly limited.

In this preferred embodiment, the mounting substrate 24 is preferably made a low temperature firing insulating ceramic (LTCC). However, the mounting substrate 24 may be made of another insulating material.

In addition, a cladding resin layer 25 covers outer side portions of the filter component 23 and the chip substrate 21. The cladding resin layer 25 preferably is made of a suitable synthetic resin, for example. The cladding resin layer 25 need not necessarily be formed.

In this preferred embodiment, among constituent elements of the ladder circuit, a plurality of first inductances L1 are provided in the chip substrate 21. On the other hand, a second inductance L2 is provided in the mounting substrate 24. Therefore, since the first inductances L1 and the second inductance L2 are not provided in the elastic wave filter chip 22, the elastic wave filter chip 22 is reduced in size. In addition, since the first inductances L1 and the second inductance L2 are separate from each other in the chip substrate 21 and the mounting substrate 24, a reduction in size of the filter device 1 as a whole is achieved.

Figure 6:
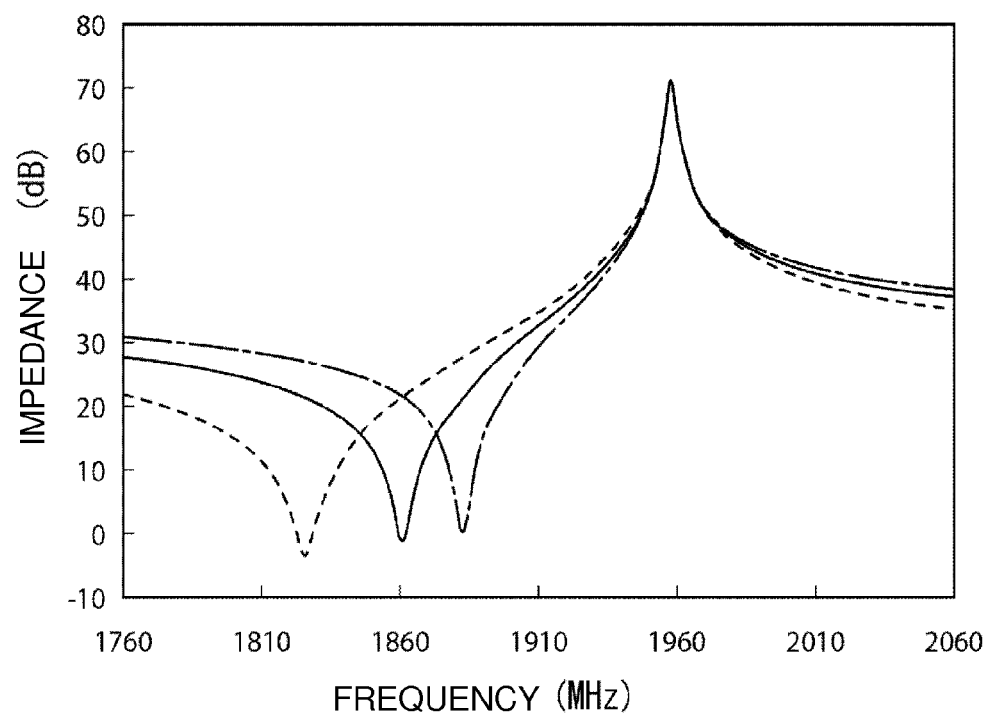
FIG. 6 illustrates the relationship between inductance values and impedance characteristics in the case where an inductance is connected in series with a resonator.

Resonance characteristics are changed by using a configuration in which inductances are connected in series with resonators, as with the first inductances L1 and the second inductance L2. In FIG. 6, an alternate long and short dash line illustrates the resonance characteristics of a surface acoustic wave resonator by itself and a solid line illustrates the resonance characteristics in the case where an inductance of about 1.0 nH is connected in series with the surface acoustic wave resonator. A dashed line illustrates resonance characteristics in a case where an inductance of about 2.0 nH is connected in series with the surface acoustic wave resonator.

As is clear from FIG. 6, the larger the value of the serially connected inductance becomes, the farther toward the low-frequency side the resonant frequency is shifted. That is, the resonant frequency is changed by serially connecting an inductance. In addition, it is clear that the relative bandwidth is capable of being increased.

In addition, in the ladder circuit illustrated in FIG. 1, the pass band is configured by the resonance characteristics of the parallel arm resonators P1 to P4 and the resonance characteristics of the series arm resonators S1 to S4.

Therefore, as has been described above, for example, the resonant frequencies are capable of being lowered by connecting the first inductances L1 to the parallel arm resonators P3 and P4 and making the values of the first inductances L1 large. Thus, the pass band is adjusted through the first inductances L1 so as to widen the pass band. Therefore, since the first inductances L1 broaden the passband, the inductances L1 may be referred to as extension coils as necessary.

The second inductance L2 is connected in series with the parallel arm resonators P1 and P2 and therefore acts in a similar way to lower the resonant frequencies. Of course, attenuation at the resonant frequencies of the parallel arm resonators is made even larger in the case of the second inductance L2. That is, attenuation at an attenuation pole is made even greater. This will be described with reference to FIG. 4.

Figure 4:
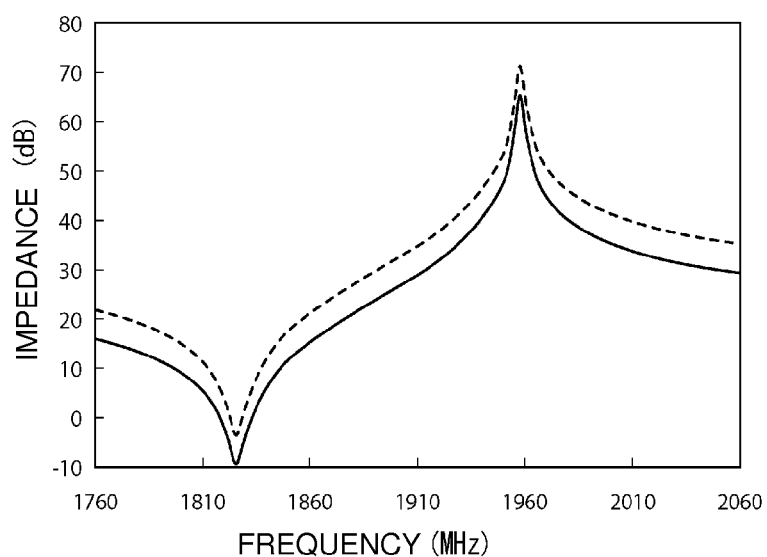
FIG. 4 illustrates impedance characteristics of a first inductance and a second inductance.

The solid line in FIG. 4 illustrates the resonance characteristics in the case where a second inductance of about 1.0 nH is connected between the common connection point of two surface acoustic wave resonators and the ground potential and the dashed line illustrates the resonance characteristics for a configuration in which a first inductance of about 2.0 nH is connected between a ground-potential-side end portion of a single surface acoustic wave resonator and the ground potential. As is clear from the solid line in FIG. 4, in the case of the second inductance L2, the impedance value at the resonant frequency is made smaller. Therefore, attenuation at the low-frequency-side attenuation pole of the ladder filter is made even larger.

Therefore, compared to the first inductance L1, the second inductance L2 provides a larger variation in the pass band of the filter.

In the filter device 1 illustrated in FIG. 3, the chip substrate 21 preferably includes a high temperature firing ceramic and the mounting substrate 24 preferably includes a low temperature firing ceramic. As a material of the chip substrate 21, a metal material capable of withstanding a high temperature has to be used as a wiring material in the high temperature firing ceramic. Therefore, a high melting point metal such as W has to be used as a conductor for the inductance inside the chip substrate 21. However, W has a higher conductivity than Cu, which is a metal having a low-melting point. Therefore, the resistance of the inductance inside the chip substrate 21 is increased and the Q value of the inductance is decreased inversely proportionally to the increase in the resistance. In addition, using a lot of comparatively expensive materials such as W, Pt and Pd, which are high-melting-point metals, as a wiring material of the filter device 1 is not desirable from an economic point of view.

On the other hand, the mounting substrate 24 is preferably formed by being fired at a low temperature. Therefore, the inductance is preferably defined by a metal with a low wiring resistance and that is a low-melting-point metal such as Cu. In addition, since Cu is a comparatively inexpensive material, it is also desirable from an economic viewpoint.

As has been described above, the Q value of the second inductance L2 more greatly affects the filter characteristics than the Q value of the first inductance L1. Therefore, as in this preferred embodiment of the present invention, it is preferable that the second inductance L2 be provided in the mounting substrate 24, in which a material such as an LTCC is used. As a result, by configuring the second inductance L2, which greatly affects the filter characteristics, using, for example, Cu which has a low wiring resistance, the Q value of the second inductance L2 is made large.

Figure 7:
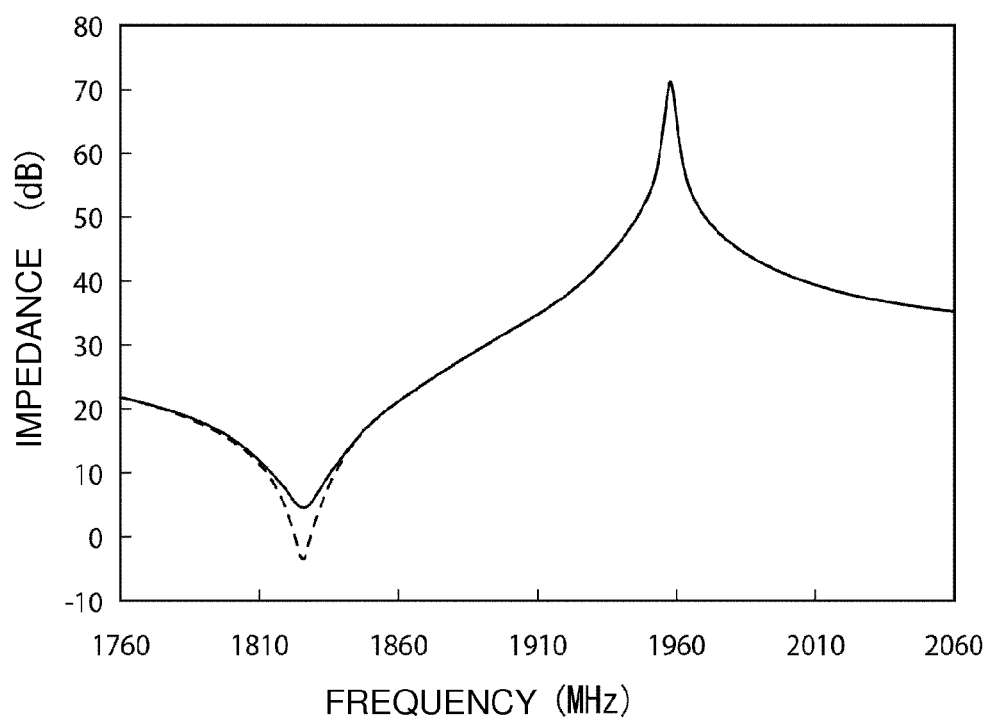
FIG. 7 illustrates resonance characteristics in a case where there is a wiring resistance and in the case where there is no wiring resistance for a configuration in which an inductance is connected in series with a resonator.

FIG. 7 illustrates changes in resonance characteristics with the magnitude of wiring resistance in a configuration in which an inductance of about 2.0 nH is connected in series with a surface acoustic wave resonator. The result in the case where the wiring resistance is substantially 0Ω is illustrated by a dashed line and the result in the case where the wiring resistance is about 1Ω is illustrated by a solid line. It is clear from FIG. 7 that if the wiring resistance is large, the Q value is decreased and the peak at the resonant frequency becomes less sharp, and the impedance ratio becomes smaller. Therefore, it is preferable that the second inductance L2, which greatly affects the filter characteristics, preferably be formed of, for example, Cu which has a low wiring resistance as described above. Therefore, it is preferable that the second inductance L2 be provided in the mounting substrate 24 as in this preferred embodiment.

Figure 5:
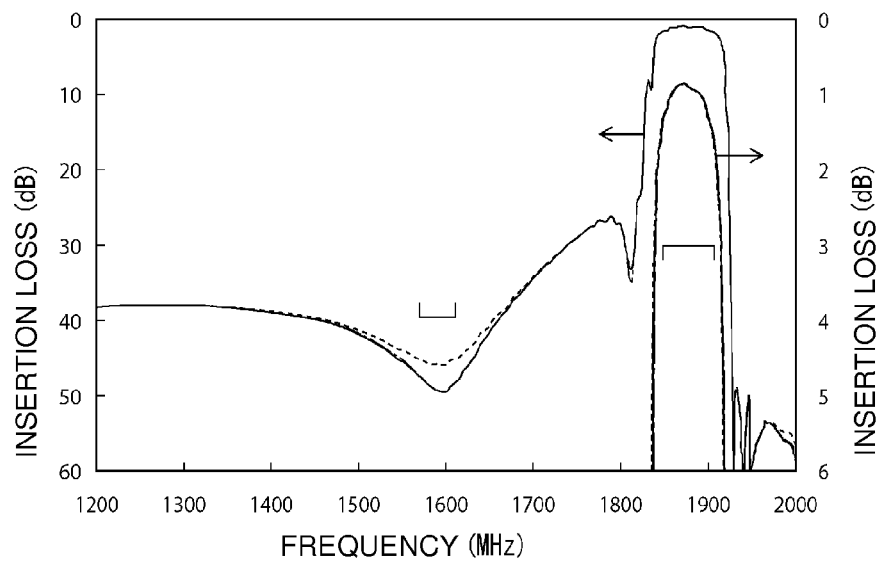
FIG. 5 illustrates attenuation-frequency characteristics of the filter device of a preferred embodiment of the present invention, of a filter device of a first comparative example and of a filter device of a second comparative example.

FIG. 5 shows changes in insertion loss (dB) of the filter device of a preferred embodiment of the present invention, of a filter device of a first comparative example and of a filter device of a second comparative example.

Of course, in the filter device 1 including a plurality of inductances, provided that at least one inductance is provided in the chip substrate 21 and a remaining at least one inductance is separately provided in the mounting substrate 24, volume taken up by mounting of the inductances is spread between the chip substrate 21 and the mounting substrate 24 and it becomes easier to reduce the size of the filter device 1. Therefore, in various preferred embodiments of the present invention, it sufficient to provide at least one inductance in the chip substrate 21 and a remaining at least one inductance in the mounting substrate 24 among the plurality of inductances that are connected between the parallel arm resonators and the ground potential.

In addition, it is preferable that the second inductance L2 be provided in the mounting substrate 24, in which the wiring resistance is low. In this case, at least one first inductance L1 among the plurality of first inductances L1 may be provided in the mounting substrate 24. That is, for the plurality of first inductances L1, at least one inductance L1 may be provided in the mounting substrate 24 and a remaining first inductance L1 may be provided in the chip substrate 21.

In addition, in this preferred embodiment, the mounting substrate 24 is preferably made of an LTCC and the chip substrate 21 is preferably made of an HTCC. However, in the present invention, the materials of the chip substrate 21 and the mounting substrate 24 are not limited to these materials. The two substrates may be made of the same insulating material, for example. Of course, it is preferable that the mounting substrate and the chip substrate 21 be configured as described above respectively using an insulating material in which the wiring resistance of wiring conductors is relatively low and using an insulating material in which the wiring resistance of wiring conductors is relatively high. In such a case, the chip substrate 21 may be made of an LTCC and the mounting substrate 24 may be made of an HTCC, for example. In this case, it is preferable that the second inductance be provided in the chip substrate 21 and that the first inductance be provided in the mounting substrate 24.

In addition, in this preferred embodiment of the present invention, Cu was given as an example of a conductor having a low wiring resistance and W was given as an example of a conductor with a high melting point and a high wiring resistance. However, the combination of wiring conductors that is capable of being used in the present invention is not limited to this combination. That is, the wiring conductors are capable of being made of a suitable metal or alloy having a relatively low wiring resistance and of a suitable metal or alloy having a relatively high wiring resistance. Specifically, other than W, conductors having a comparatively high wiring resistance such as Pt and Pd which have a high melting point are capable of being used, for example.

In addition, in the above-described preferred embodiments, the series arm resonators S1 to S4 and the parallel arm resonators P1 to P4 preferably include surface acoustic wave resonators, but instead may include boundary acoustic wave resonators or bulk elastic wave resonators.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter device comprising:
a mounting substrate; and
a filter component mounted on the mounting substrate; wherein
the filter component includes a chip substrate and an elastic wave filter chip mounted on the chip substrate;
the elastic wave filter chip includes a ladder circuit configuration including a plurality of series arm resonators, which are arranged in a series arm that connects an input terminal and an output terminal and each of the plurality of series arm resonators include an elastic wave resonator, and a plurality of parallel arms, which are connected between the series arm and a ground potential, a parallel arm resonator including an elastic wave resonator arranged in each of the parallel arms;
the filter device further comprising a plurality of inductances that are connected between ground-potential-side end portions of the parallel arm resonators arranged in the parallel arms and the ground potential; wherein
the plurality of inductances, which are connected between the ground-potential-side end portions of the plurality of parallel arm resonators and the ground potential, includes at least one first inductance that is connected between one of the ground-potential-side end portions of one of the parallel arm resonators and the ground potential, and a second inductance that is connected between a common connection point at which the ground-potential-side end portions of at least two of the plurality of the parallel arm resonators are commonly connected and the ground potential;
among the plurality of inductances, the at least one first inductance is provided in the chip substrate and a remaining one of the plurality of inductances is provided in the mounting substrate; and
the chip substrate includes a first wiring conductor, the mounting substrate includes a second wiring conductor, a wiring resistance of the second wiring conductor is lower than a wiring resistance of the first wiring conductor, and the second inductance is defined by the second wiring conductor in the mounting substrate.

2. The filter device according to claim 1, wherein, the at least one first inductance includes a plurality of first inductances, and among the plurality of first inductances of the plurality of inductances, at least one of the plurality of first inductances is provided in the chip substrate and a remaining one of the plurality of first inductances is provided in the mounting substrate.

3. The filter device according to claim 1, further comprising a resin layer that covers outer side portions of the filter component and the chip substrate.

4. The filter device according to claim 1, wherein the chip substrate and the mounting substrate are made of a same material.

5. The filter device according to claim 1, wherein the plurality of series arm resonators and the plurality of parallel arm resonators each include one of surface acoustic wave resonators, boundary acoustic wave resonators and bulk elastic wave resonators.

6. A filter device comprising:
a mounting substrate; and
a filter component mounted on the mounting substrate; wherein
the filter component includes a chip substrate and an elastic wave filter chip mounted on the chip substrate;
the elastic wave filter chip includes a ladder circuit configuration including a plurality of series arm resonators, which are arranged in a series arm that connects an input terminal and an output terminal and each of the plurality of series arm resonators include an elastic wave resonator, and a plurality of parallel arms, which are connected between the series arm and a ground potential, a parallel arm resonator including an elastic wave resonator arranged in each of the parallel arms;
the filter device further comprising a plurality of inductances that are connected between ground-potential-side end portions of the parallel arm resonators arranged in the parallel arms and the ground potential; wherein
among the plurality of inductances, at least one of the inductances is provided in the chip substrate and a remaining at least one of the inductances is provided in mounting substrate; and
the chip substrate includes a high temperature firing ceramic and the mounting substrate includes a low temperature firing ceramic having a firing temperature that is lower than that of the high temperature firing ceramic.

7. A duplexer comprising:
an antenna terminal;
a transmission filter; and
a reception filter connected to the antenna terminal and the transmission filter; wherein
the reception filter includes first and second longitudinally coupled resonator elastic wave filter units;
the transmission filter includes:
a mounting substrate; and
a filter component mounted on the mounting substrate; wherein
the filter component includes a chip substrate and an elastic wave filter chip mounted on the chip substrate;
the elastic wave filter chip includes a ladder circuit configuration including a plurality of series arm resonators, which are arranged in a series arm that connects an input terminal and an output terminal and each of the plurality of series arm resonators include an elastic wave resonator, and a plurality of parallel arms, which are connected between the series arm and a ground potential, a parallel arm resonator including an elastic wave resonator arranged in each of the parallel arms;
the transmission filter further comprising a plurality of inductances that are connected between ground-potential-side end portions of the parallel arm resonators arranged in the parallel arms and the ground potential; wherein among the plurality of inductances, at least one of the inductances is provided in the chip substrate and a remaining at least one of the inductances is provided in mounting substrate.

8. The duplexer according to claim 7, wherein the transmission filter is defined by a filter device.

9. The duplexer according to claim 7, further comprising a resin layer that covers outer side portions of the filter component and the chip substrate.

10. The duplexer according to claim 7, wherein the chip substrate and the mounting substrate are made of a same material.

11. The duplexer according to claim 7, wherein the plurality of series arm resonators and the plurality of parallel arm resonators each include one of surface acoustic wave resonators, boundary acoustic wave resonators and bulk elastic wave resonators.

12. A duplexer comprising:
an antenna terminal;
a transmission filter; and
a reception filter connected to the antenna terminal and the transmission filter; wherein
the transmission filter includes:
    a mounting substrate; and
    a filter component mounted on the mounting substrate; wherein
the filter component includes a chip substrate and an elastic wave filter chip mounted on the chip substrate;
the elastic wave filter chip includes a ladder circuit configuration including a plurality of series arm resonators, which are arranged in a series arm that connects an input terminal and an output terminal and each of the plurality of series arm resonators include an elastic wave resonator, and a plurality of parallel arms, which are connected between the series arm and a ground potential, a parallel arm resonator including an elastic wave resonator arranged in each of the parallel arms;
the transmission filter further comprising a plurality of inductances that are connected between ground-potential-side end portions of the parallel arm resonators arranged in the parallel arms and the ground potential;
among the plurality of inductances, at least one of the inductances is provided in the chip substrate and a remaining at least one of the inductances is provided in mounting substrate; and
the chip substrate includes a high temperature firing ceramic and the mounting substrate includes a low temperature firing ceramic having a firing temperature that is lower than that of the high temperature firing ceramic.

13. A duplexer comprising:
an antenna terminal;
a transmission filter; and
a reception filter connected to the antenna terminal and the transmission filter; wherein
the transmission filter includes:
    a mounting substrate; and
    a filter component mounted on the mounting substrate; wherein
the filter component includes a chip substrate and an elastic wave filter chip mounted on the chip substrate;
the elastic wave filter chip includes a ladder circuit configuration including a plurality of series arm resonators, which are arranged in a series arm that connects an input terminal and an output terminal and each of the plurality of series arm resonators include an elastic wave resonator, and a plurality of parallel arms, which are connected between the series arm and a ground potential, a parallel arm resonator including an elastic wave resonator arranged in each of the parallel arms;
the transmission filter further comprising a plurality of inductances that are connected between ground-potential-side end portions of the parallel arm resonators arranged in the parallel arms and the ground potential; wherein
the plurality of inductances, which are connected between the ground-potential-side end portions of the plurality of parallel arm resonators and the ground potential, includes at least one first inductance that is connected between one of the ground-potential-side end portions of one of the parallel arm resonators and the ground potential, and a second inductance that is connected between a common connection point at which the ground-potential-side end portions of at least two of the plurality of the parallel arm resonators are commonly connected and the ground potential;
among the plurality of inductances, the at least one first inductance is provided in the chip substrate and a remaining one of the plurality of inductances is provided in the mounting substrate; and
the chip substrate includes a first wiring conductor, the mounting substrate includes a second wiring conductor, a wiring resistance of the second wiring conductor is lower than a wiring resistance of the first wiring conductor, and the second inductance is defined by the second wiring conductor in the mounting substrate.

14. The duplexer according to claim 13, wherein, the at least one first inductance comprises a plurality of first inductances, and among the plurality of first inductances of the plurality of inductances, at least one of the plurality of first inductances is provided in the chip substrate and a remaining one of the plurality of first inductances is provided in the mounting substrate.

* * * * *